United States Patent [19]
Aoyama

[11] 4,101,843
[45] Jul. 18, 1978

[54] AUTOMATIC RECORDING LEVEL CONTROL CIRCUIT WITH MANUAL SENSITIVITY COMPENSATING CIRCUIT

[75] Inventor: Eiji Aoyama, Tokyo, Japan

[73] Assignee: Nihon Beru-Haueru Kabushiki Kaisha, Higashimurayama, Japan

[21] Appl. No.: 746,780

[22] Filed: Dec. 2, 1976

[51] Int. Cl.² ............................................ H03G 1/02
[52] U.S. Cl. ................................. 330/280; 179/1 VL; 330/86; 330/134; 330/145; 330/282; 330/284

[58] Field of Search ..................... 330/28, 29, 86, 134, 330/145; 325/399, 402, 403, 425; 179/1 VL

[56] References Cited

U.S. PATENT DOCUMENTS

| | | | |
|---|---|---|---|
| 3,098,199 | 7/1963 | Carney et al. | 330/29 |
| 3,416,094 | 12/1968 | Nakamura | 330/86 X |
| 3,665,332 | 5/1972 | Campbell | 330/134 X |
| 3,725,800 | 4/1973 | Papay | 330/145 X |

Primary Examiner—James B. Mullins
Attorney, Agent, or Firm—Roger M. Fitz-Gerald; John H. Moore; Aaron Passman

[57] ABSTRACT

A sensitivity control circuit is described for use with a sound movie camera having an automatic sound level control circuit. In one embodiment, the automatic sound level control circuit includes a pair of cascaded amplifiers whose overall gain is controlled by the conduction of an active control element. The active control element has an input terminal which receives a control signal representative of the amplitude of the signal output of the cascaded amplifiers. To desensitize the automatic sound level control circuit to background noise, a voltage source and a variable impedance element are serially coupled to the control terminal of the active control element to provide a control current for selectably varying the conduction of the active control element. The gain of the cascaded amplifiers is thereby selectively controlled and the sensitivity of the automatic sound level control circuit is reduced.

10 Claims, 9 Drawing Figures

AUTOMATIC RECORDING LEVEL CONTROL CIRCUIT WITH MANUAL SENSITIVITY COMPENSATING CIRCUIT

BACKGROUND OF THE INVENTION

This invention relates generally to control circuitry for automatically controlling the level of sound recording and particularly to such control circuitry for use in sound movie cameras.

In the past, movie cameras have been provided with means for recording the sound associated with simultaneously recorded video. Such cameras typically include an automatic sound level control circuit which causes sounds of different intensities to be amplified and recorded in inverse proportion to their respective intensities. That is, low intensity sounds are amplified to a greater extent than higher intensity sounds so that all reproduced sounds have similar intensities.

A drawback associated with such controls is that, in the absence of a desired sound such as human speech, low intensity background noises are greatly amplified and reproduced at an undesirably high intensity.

OBJECTS OF THE INVENTION

Accordingly, it is an object of this invention to provide an improved sound control circuit for sound movie cameras.

It is another object of this invention to provide, for use in a sound movie camera, a variable sensitivity control circuit for rendering an automatic sound level control circuit less sensitive to background noises.

BRIEF DESCRIPTION OF THE DRAWINGS

These and other objects of the invention are more particularly set forth in the following detailed description and in the accompanying drawings of which.

DESCRIPTION OF THE PREFERRED EMBODIMENT

Figure 1:
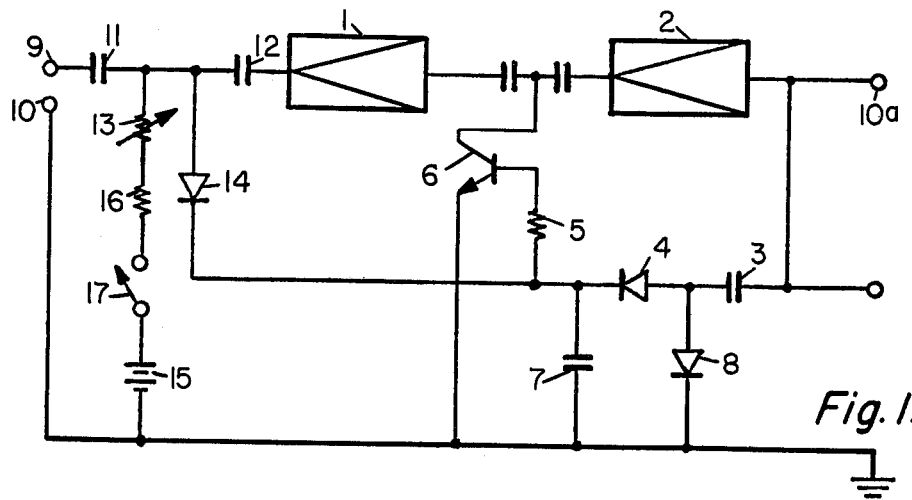
FIG. 1 is a circuit diagram schematically illustrating an automatic sound level control circuit and a sensitivity control circuit according to this invention.

Referring first to FIG. 1, there is shown an automatic sound level control circuit of the type used in movie cameras and a sensitivity control circuit for rendering the sound level control circuit selectably less sensitive to background noise.

The automatic sound level control circuit includes an amplifier circuit and a gain control circuit. The amplifier circuit includes a pair of cascaded amplifiers 1 and 2, of conventional design, for amplifying sound signals received from a microphone (not shown).

Th combined gain of the amplifiers 1 and 2 is controlled by the gain control circuit comprising an active control element, indicated herein as a transistor 6, and a capacitor 3 serially coupled through a diode 4 and a resistor 5 to the input or base terminal of transistor 6.

The output or collector terminal of the transistor 6 is connected to the junction between the amplifiers 1 and 2, while the emitter terminal is connected to a reference voltage level, indicated herein as ground. The conduction of transistor 6 is controlled in a manner to be described for varying the combined gain of the amplifiers 1 and 2.

Also included in the gain control circuit is a capacitor 7 and a diode 8 coupled between opposite ends of the diode 4 and ground. The diode 4 and the capacitor 7 operate together as a detector for generating a control voltage across the capacitor 7 for controlling the conduction of transistor 6 and the overall gain of the amplifiers 1 and 2.

In operation, a sound signal is received at input terminals 9 and 10 from a microphone and is coupled through capacitors 11 and 12 to the input of the amplifier 1. The output of amplifier 1 is capacitively coupled to amplifier 2 for further amplification, whence it is coupled to an output terminal 10a for transmission to sound recording circuitry.

In order to generate a control signal for controlling the overall combined gain of amplifiers 1 and 2, the amplified sound signal is coupled via capacitor 3 to the diode 4 and the capacitor 7 for detection. The resultant control voltage developed across the capacitor 7 is representative of the amplitude of the sound signal received from the amplifier 2, i.e., the greater the magnitude of the sound signal, the greater the magnitude of the control voltage.

Because the base terminal of transistor 6 is coupled to the control voltage via resistor 5, the degree of conduction of the transistor 6 is controlled by the amplitude of the control voltage. Accordingly, when a large amplitude sound signal is received from the amplifier 2, a correspondingly large amplitude control voltage is generated and the transistor 6 conducts heavily. By virtue of the conduction of the transistor 6, a portion of the sound signal present at the collector terminal of transistor 6 is coupled through transistor 6 to ground. As a result, the sound signal output of the amplifier 2 is correspondingly reduced.

When low level sound signals such as background noise are the only sound signals received at input terminal 9, a very small control voltage is generated and transistor 6 conducts to a much lesser degree, as a result of which the background noise becomes greatly amplified. Moreover, the amplitude of the amplified background noise approaches the amplitude of higher lever amplified signals. The result is that all sound signals received at input terminal 9 tend to have the same amplitude at output terminal 10a.

In order to lower the sensitivity of the control circuitry to background noise, a variable sensitivity control circuit is provided, which circuit includes a current source comprising a selectably variable impedance element such as variable resistor 13, a fixed value resistor 16 serially coupled to variable resistor 13, diode 14 and a voltage source 15. A switch 17 is coupled between the voltage source 15 and the resistor 16 for selectively enabling or disabling the sensitivity control circuit.

When the elements 13-17 are connected as shown, a path for a DC control current is provided from voltage source 15, through switch 17, resistors 16 and 13, and diode 14 to the base terminal of transistor 6 via resistor 5. The DC control current increases the conduction of the transistor 6. Thus, the conduction of the transistor 6 is controlled both by value of the control voltage present on capacitor 7 and by the current injected into the base terminal of transistor 6 from the voltage source 15. The current provided from voltage source 15 causes transistor 6 to conduct more heavily, as when a high level sound is received, and reduces the overall combined gain of amplifiers 1 and 2. Accordingly, when only background noise signals are received at the input terminal 9, the variable resistor 13 may be adjusted to provide the desired additional conduction of transistor 6 required to lower the overall combined gain of amplifiers 1 and 2 to a point where the amplified background noise at output terminal 10a is of an acceptable amplitude.

In the embodiment shown in FIG. 1, diode 14 is placed in the path of the DC control current so that the control voltage present on capacitor 7 will not leak off to ground through resistors 13 and 16 and voltage source 15. The resistor 16 is optional and is included to prevent excessive DC control current from flowing when the value of variable resistor 13 is set near or at zero ohms. The capacitors 11 and 12 are included to prevent the DC control current from flowing to the microphone and to the amplifier 1, respectively.

Figure 2:
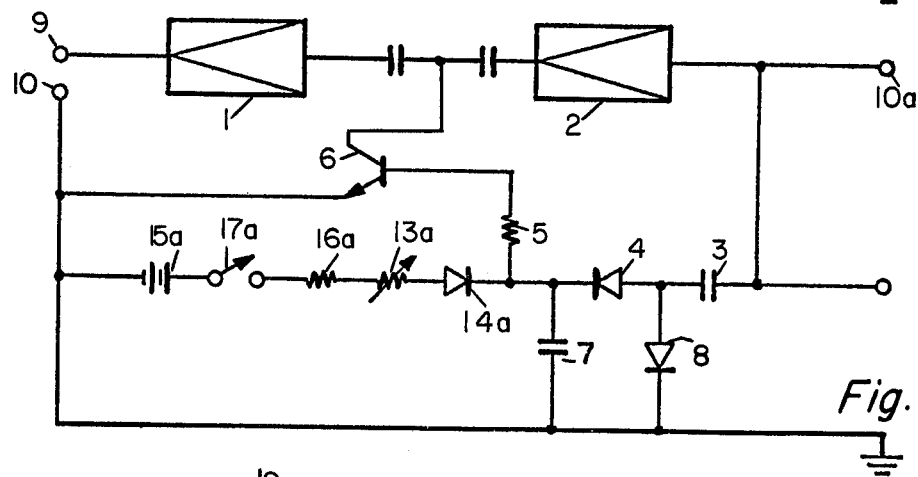
FIGS. 2 and 3 are schematic diagrams illustrating alternate embodiments of the circuitry shown in FIG. 1.

Turning now to FIG. 2, there is shown an alternate embodiment of this invention wherein reference numerals identical to those used in FIG. 1 indicate identical elements. Reference numerals followed by the letter a indicate elements included in the sensitivity control circuit which are similar to like elements of FIG. 1. A similar use of like reference numerals is used in the remaining figures.

The sensitivity control circuit of FIG. 2 differs from that of FIG. 1 in that the elements comprising the sensitivity control circuit are coupled between resistor 5 and ground so as to avoid the use of capacitors 11 and 12 of FIG. 1. Otherwise the operation of the circuit of FIG. 2 is identical to that of FIG. 1.

As indicated in FIG. 2, the sensitivity control circuit includes a variable resistor 13a, a diode 14a, a voltage source 15a, a fixed value resistor 16a, and a switch 17a. The elements 13a-17a are connected in series between ground and one end of resistor 5. As with the circuit of FIG. 1, a DC control current is provided in the path defined by the series connection of elements 13a-17a for modifying the conduction level of the transistor 6, all as described above with reference to FIG. 1.

Figure 3:
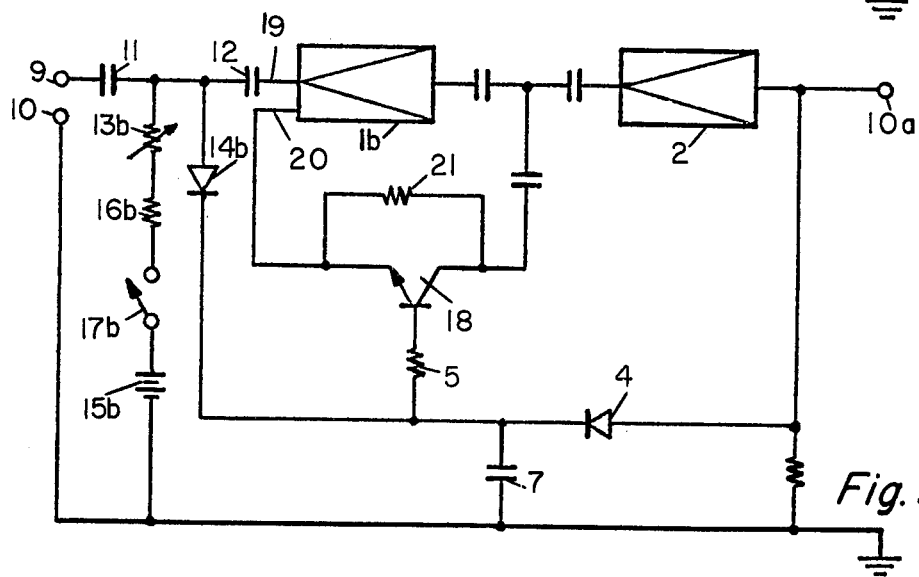

Referring now to FIG. 3, there is shown another embodiment of an automatic sound level control circuit incorporating the sensitivity control circuit described above. In this circuit, the sensitivity control circuit is identical to that shown in FIG. 1, but the manner of controlling the gain of the amplifiers is modified. In this case, the amplifier 1b includes a pair of input terminals 19 and 20. Input terminal 19 receives sound signals from the input terminal 9 via capacitors 11 and 12 while input terminal 20 is a gain control terminal for receiving a signal for controlling the gain of the amplifier 1b. The input terminal 19 receives a sound signal of a first polarity and the gain control terminal 20 receives a sound signal which may be of the same polarity. The difference between the signals at terminals 19 and 20 may then be used to control the gain of amplifier 1b. Such amplifiers are well known in the art and are not described in detail herein.

The control signal ultimately affecting the gain of amplifier 1b is developed by coupling the amplified sound signal from amplifier 2 to a detector comprising the diode 4 and the capacitor 7. A control signal whose level corresponds to the amplitude of the amplified sound signal from the amplifier 2 is developed across capacitor 7. Capacitor 7 is connected to the base terminal of a transistor 18 via resistor 5 so that the control voltage present across capacitor 7 can control the level of conduction of the transistor 18.

The transistor 18 has a controller terminal which is coupled to the output of amplifier 1b and an emitter terminal which is connected to the gain control terminal 20 of the same amplifier. A resistor 21 is connected from the emitter terminal of transistor 18 to the collector terminal thereof.

When a control voltage of sufficient amptitude is developed across capacitor 7, transistor 18 is forced into conduction, thereby coupling a portion of the amplified sound signal from the output of amplifier 1b to its gain control terminal 20, thereby reducing the gain of amplified 1b.

The sensitivity control circuit comprising elements 13b-17b, identical to elements 13-17 of FIG. 1, are serially coupled from ground to the base terminal of transistor 18 via resistor 5 and act to desensitize the automatic sound level control circuit by providing a DC control current to the base terminal of transistor 18, all as described above with reference to FIG. 1.

Figure 4:
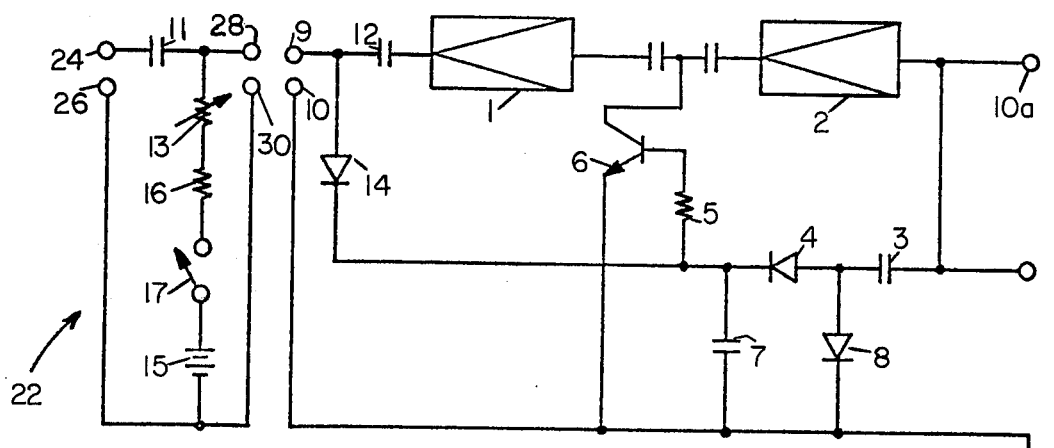
FIG. 4 is a schematic diagram illustrating how the sensitivity control circuit and the automatic sound level control circuit of FIG. 1 may be constructed independently of one another for enclosure in separate housings.

Referring now to FIG. 4, there is shown a circuit which differs from that of FIG. 1 only in that the sensitivity control circuit, identified by reference numeral 22, is not constructed integrally with the remainder of the circuit. Rather, it is constructed separately and housed in an adapter for interfacing a microphone with the reaminder of the circuit.

As shown in FIG. 4, the sensitivity control circuit 22 has a pair of input terminals 24 and 26 for receiving sound signals from a microphone. A pair of output terminals 28 and 30 are connectable to terminals 9 and 10, respectively, of the automatic sound level control circuit. When terminal 28 is connected to terminal 9 and terminal 30 is connected to terminal 10, the circuit of FIG. 4 operates identically to that of FIG. 1.

Figure 6:
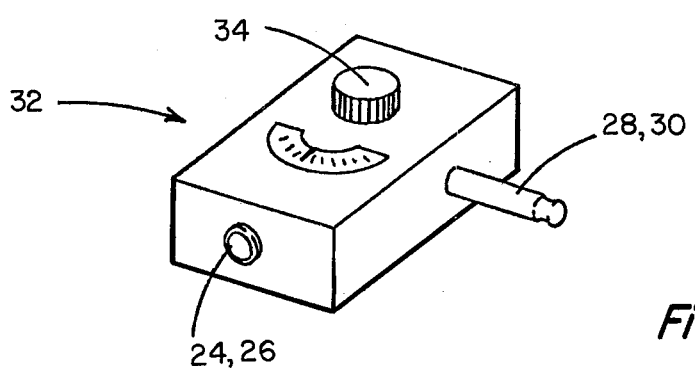
FIG. 6 illustrates an adapter for housing the sensitivity control circuits of FIGS. 4 and 5.

A suitable housing for the sensitivity control circuit 22 is shown in FIG. 6. The housing 32 includes a female receptacle having terminals 24 and 26 and a jack having terminals 28 and 30. The jack plugs into a mating female receptacle in a camera housing having terminals corresponding to terminals 9 and 10 of FIG. 4, while the female receptacle receives a mating jack from a microphone.

A knob 34 is connected to the variable resistor 13 inside the housing 32 for adjusting the sensitivity of the circuit to background noise. Thus, a convenient adapter is provided which may be removed from the camera when the sensitivity control circuit is not required.

Figure 5:
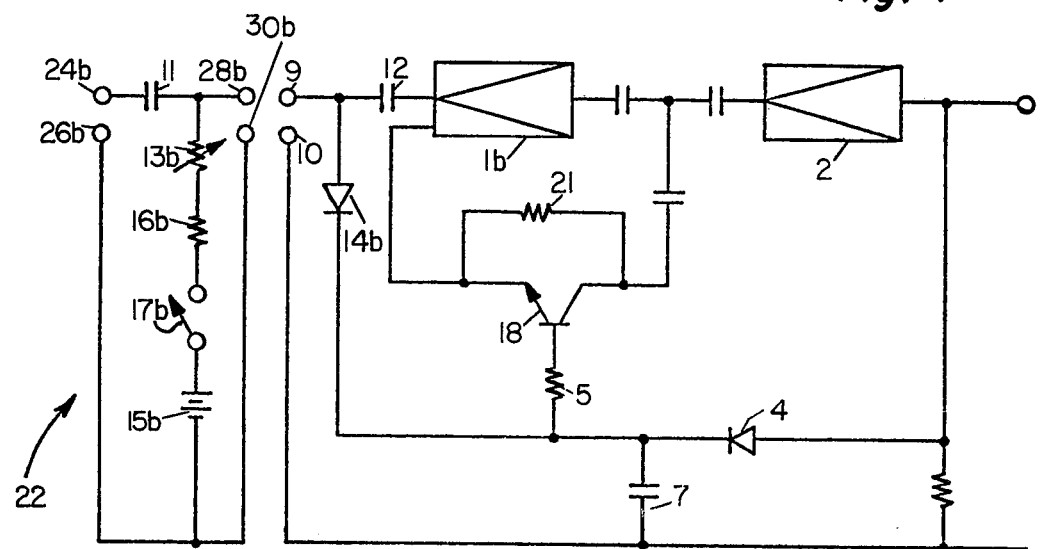
FIG. 5 is a schematic diagram illustrating how the sensitivity control circuit and the automatic sound level control circuit of FIG. 3 may be constructed independently of one another for enclosure in separate housings.

The circuit of FIG. 3 may also be constructed so as to enclose the sensitivity control circuit 22 in an adapter. Such an arrangement is shown in FIG. 5 wherein the sensitivity control circuit 22, comprising elements 13b–17b, has a pair of terminals 28b and 30b. Terminals 28b and 30b are connectable to terminals 9 and 10 of the automatic sound level control circuit. The sound input from a microphone is applied to terminals 24b and 26b.

The adapter shown in FIG. 6 may house the sensitivity control circuit 22 of FIG. 5, in which case the female receptacle of the housing 32 will have terminals corresponding to terminals 24b and 26b of FIG. 5. Likewise, the jack on the housing 32 will have terminals corresponding to terminals 28b and 30b of FIG. 5, which jack will mate with a female receptacle in a camera housing having terminals corresponding to terminals 9 and 10 of FIG. 6.

Figure 7:
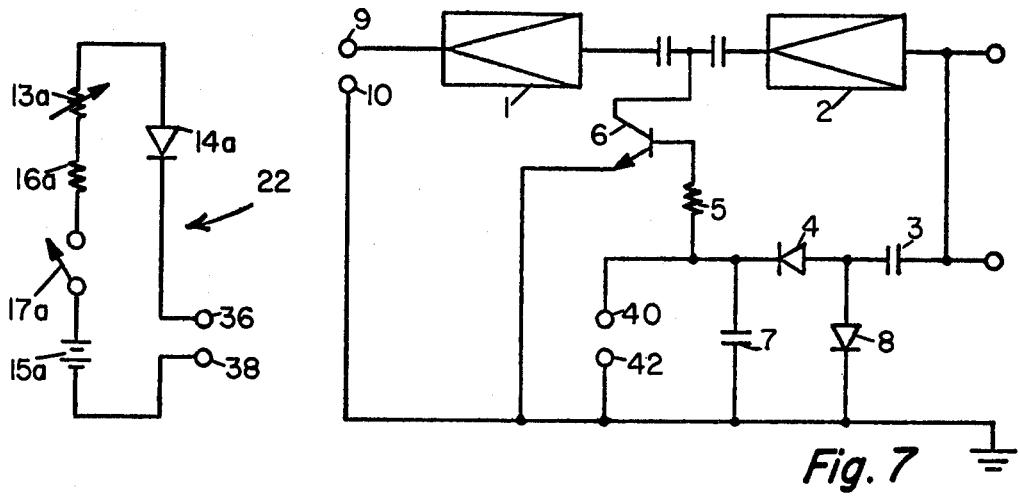
FIG. 7 is a schematic diagram illustrating how the sensitivity control circuit and the automatic sound level control circuit of FIG. 2 may be constructed independently of one another for enclosure in separate housings.

The circuit of FIG. 2 may also be constructed so that the sensitivity control portion of the circuit is housed in a removable adapter. As shown in FIG. 7, the sensitivity control circuit 22 has a pair of terminals 36 and 38 which are connectable to terminals 40 and 42, respectively, of the automatic sound level circuit. This sensitivity control circuit 22 may be constructed within a housing or adapter such as housing 44 of FIG. 8. In that case, the jack of housing 44 would have terminals corresponding to terminals 36 and 38 of FIG. 7 and the camera housing would have a female receptacle with terminals corresponding to terminals 40 and 42.

Figure 8:
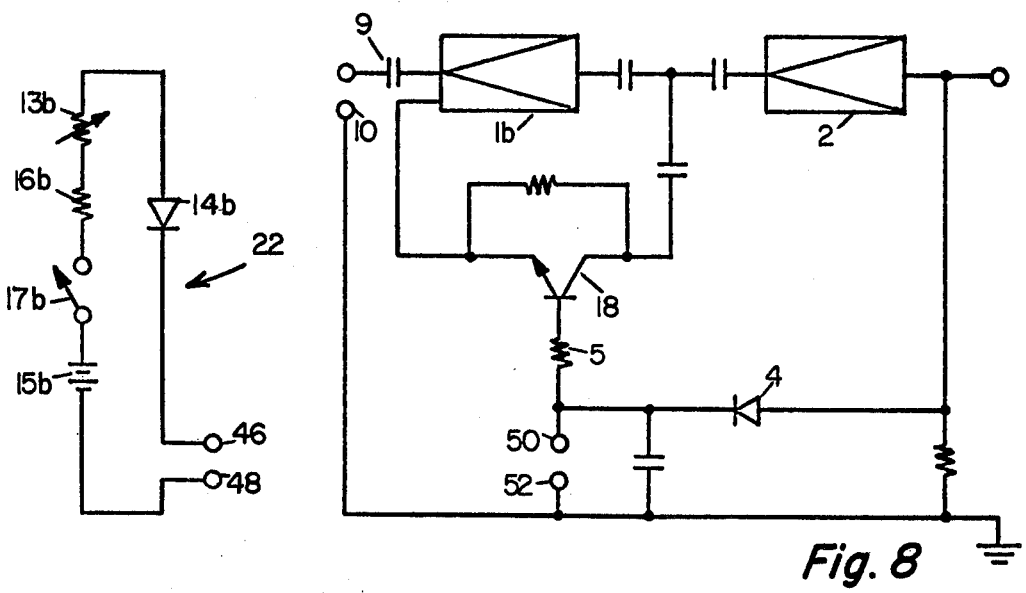
FIG. 8 is a schematic diagram illustrating a modified version of the circuitry of FIG. 3 wherein the sensitivity control circuit and the automatic sound level control circuit may be constructed independently of one another for enclosure in separate housings.
Figure 9:
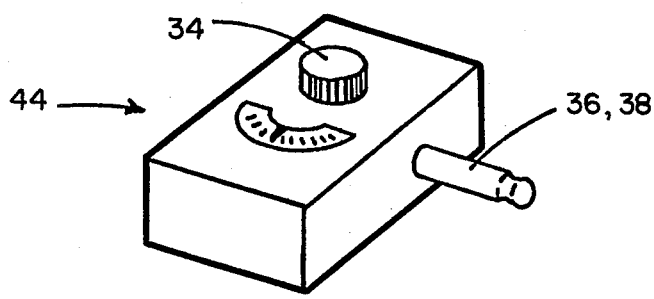
FIG. 9 illustrates an adapter for housing the sensitivity control circuits of FIGS. 7 and 8.

Referring now to FIG. 8, there is shown a circuit similar to that of FIG. 3 except that the sensitivity control circuit 22 is adapted to be enclosed by a separate housing such as housing 44 of FIG. 9 and the sensitivity control circuit 22 is connected directly between ground and resistor 5, thereby avoiding the use of the capacitor 11 of FIG. 3 which blocks the DC control current from reaching the microphone. In other respects, the circuitry of FIG. 8 operates identically to the circuitry of FIG. 3.

The sensitivity control circuit 22 of FIG. 8 includes terminals 46 and 48 which are connectable to terminals 50 and 52, respectively, of the automatic sound level circuit. When the circuit 22 is enclosed in a housing such as housing 44 of FIG. 9, the jack will have terminals corresponding to terminals 46 and 48 and the camera housing will have a female receptacle having terminals corresponding to terminals 50 and 52 of FIG. 8.

In the foregoing disclosure, a number of embodiments of a sensitivity control circuit have been described for use with a sound movie camera having an automatic sound level circuit. In furtherance of the objectives of this invention, the described embodiments effectively desensitize the automatic sound level circuit from background noise, whereby the degree of amplification of the background noise can be tailored to a specific environment.

In light of the description of the various embodiments of the invention, it will be obvious to those skilled in the art that many alterations and variations can be made to the described embodiments. Accordingly, it is intended to embrace all such alterations and variations which fall within the spirit and scope of this invention as defined by the appended claims.

I claim:

1. For use with a sound movie camera having an automatic sound level control circuit in which the gain of a pair of cascaded amplifiers is controlled by the conduction of an active control element having an input terminal receiving a conduction control signal representative of the amplitude of the output of the cascaded amplifiers, a variable sensitivity control circuit for remote control, comprising:
   a housing for the control circuit;
   a voltage source within said housing; and
   a variable impedance element in said housing and serially coupled between said voltage source and the input terminal of the active control element said coupling detachably associated with the camera for remote manual adjustment of the sensitivity control circuit,
   whereby a selectable amount of control current is provided through said voltage source and said variable impedance element for selectively controlling the conduction of the active control element for selectively varying the combined gain of the cascaded amplifiers.

2. A sensitivity control circuit as set forth in claim 1 including a diode serially coupled between said variable impedance element and the input terminal of the active control element.

3. A sensitivity control circuit as set forth in claim 2 including a switch serially connected between said voltage source and the input terminal of the active control element, whereby the sensitivity control circuit may be selectively disabled and enabled.

4. A sensitivity control circuit as set forth in claim 3 wherein the active control element comprises a transistor having a collector terminal connected to a junction between the cascaded amplifiers, an emitter terminal connected to a reference voltage source, and a base terminal receiving a control signal representative of the amplitude of the output of the cascaded amplifiers and being coupled to the serially connected combination of said diode, said variable impedance element, said switch, and said voltage source.

5. For use with a sound movie camera having an automatic sound level control circuit in which the gain of an amplifier is controlled by the conduction of an active control element which feeds back a controlled amount of signal from the output of the amplifier to an input thereof and which has a control terminal receiving a conduction control signal representative of the amplitude of the output of the amplifier for controlling the conduction of the active control element, a sensitivity control circuit for remote control, comprising:
   a housing for the control circuit;
   a voltage source within said housing; and
   a variable impedance element in said housing and serially coupled between said voltage source and the control terminal of the active control element said coupling detachably associated with the camera for remote manual adjustment of the sensitivity control circuit,
   whereby a selectable amount of control current is provided through said voltage source and said variable impedance element for selectively controlling the conduction of the active control element for selectively varying the gain of the amplifier.

6. A sensitivity control circuit as set forth in claim 5 including a diode serially coupled between said variable impedance element and the control terminal of the active control element.

7. A sensitivity control circuit as set forth in claim 6 including a switch serially connected between said voltage source and the control terminal of the active control element, whereby the sensitivity control circuit may be selectively switched in and out of the automatic sound level control circuit.

8. A sensitivity control circuit as set forth in claim 7 wherein the active control element comprises a transistor having a collector terminal coupled to the output of the amplifier, a base terminal which comprises said control terminal, and an emitter terminal coupled to the input of the amplifier for adjusting the gain.

9. For use with a sound movie camera and a microphone, an automatic sound level control circuit with a variable sensitivity control, comprising:

a first amplifier having an input terminal coupled to the microphone and having an output terminal;

a second amplifier having an input terminal for receiving a sound signal from the output terminal of said first amplifier and having an output terminal;

a detector coupled to the output terminal of said second amplifier for generating a control signal;

a control transistor having a collector terminal coupled to the output terminal of said first amplifier, an emitter terminal coupled to a reference voltage level, and a base terminal receiving the control signal; and a detachable housing containing a variable control current source comprising a voltage source serially coupled to a variable impedance element, said control source being detachably coupled to the base terminal of said control transistor for remote adjustment, whereby the control signal remotely varies the conduction of said control transistor to vary the magnitude of the signal input to said second amplifier and, upon adjusting said variable impedance element, a selected amount of control current is applied to the base terminal of said control transistor for adjusting both its conduction and the combined gain of said first and second amplifiers.

10. For use with a sound movie camera and a microphone, an automatic sound level control circuit with a variable sensitivity control, comprising:

a variable gain amplifier having a sound input terminal coupled to the microphone, an output terminal, and a gain control terminal;

a second amplifier having an input terminal for receiving a sound signal from the output terminal of said first amplifier and having an output terminal;

a detector coupled to the output terminal of said second amplifier for generating a control signal;

a control transistor having an emitter terminal coupled to the gain control terminal of said first amplifier, a collector terminal coupled to the output terminal of said first amplifier, and a base terminal receiving the control signal; and a detachable housing containing a variable control current source comprising a voltage source serially coupled to a variable impedance element, said control current source being detachably coupled to the base terminal of said control transistor for remote adjustment, whereby the control signal remotely varies the conduction of said control transistor to vary the gain of said variable gain amplifier and upon adjusting said variable impedance element, a selected amount of control current is applied to the base terminal of said control transistor for selectably adjusting its conduction and the gain of said variable gain amplifier.

* * * * *

UNITED STATES PATENT OFFICE
CERTIFICATE OF CORRECTION

PATENT NO. : 4,101,843
DATED : July 18, 1978
INVENTOR(S) : Eiji Aoyama

It is certified that error appears in the above-identified patent and that said Letters Patent are hereby corrected as shown below:

Column 7, line 31 (Claim 9, line 19), after "trol", insert
--current--.

Signed and Sealed this

Twelfth Day of June 1979

[SEAL]

Attest:

RUTH C. MASON
Attesting Officer

DONALD W. BANNER
Commissioner of Patents and Trademarks